(12) United States Patent
Nozu

(10) Patent No.: US 8,264,000 B2
(45) Date of Patent: Sep. 11, 2012

(54) SEMICONDUCTOR DEVICE WITH A PROTECTION DIODE

(75) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 12/816,096

(22) Filed: Jun. 15, 2010

(65) Prior Publication Data

US 2010/0327411 A1  Dec. 30, 2010

(30) Foreign Application Priority Data

Jun. 24, 2009  (JP) .................................. 2009-149556

(51) Int. Cl.
*H01L 29/66* (2006.01)
(52) U.S. Cl. ................. 257/173; 257/E29.327
(58) Field of Classification Search .................. 257/546, 257/173, 356, 355, 328, E29.327, 362
See application file for complete search history.

(56) References Cited

U.S. PATENT DOCUMENTS
2009/0039432 A1*  2/2009  Nishimura et al. ........... 257/362

FOREIGN PATENT DOCUMENTS
JP  2000-294778  10/2000

* cited by examiner

*Primary Examiner* — A. Sefer
*Assistant Examiner* — Nikolay Yushin
(74) *Attorney, Agent, or Firm* — Patterson & Sheridan, LLP

(57) ABSTRACT

According to one embodiment, a semiconductor device includes a semiconductor substrate, a semiconductor region, a first and second electrodes. The semiconductor region is provided on the semiconductor substrate via an insulating film. The semiconductor region includes a protection diode. An overvoltage causes breakdown of the protection diode. A PN junction of the protection diode is exposed at an end face of the semiconductor region. A first and second electrodes are provided distally to the exposed end face of the PN junction. The first and second electrodes are connected to the semiconductor region to provide a current to the protection diode.

13 Claims, 4 Drawing Sheets

SEMICONDUCTOR DEVICE WITH A PROTECTION DIODE

CROSS-REFERENCE TO RELATED APPLICATIONS

This application is based upon and claims the benefit of priority from the prior Japanese Patent Application No. 2009-1495.56, filed on Jun. 24, 2009; the entire contents of which are incorporated herein by reference.

FIELD

Embodiments described herein relate generally to a semiconductor device.

BACKGROUND

Trends in recent years of higher speeds and greater information volumes have led to increasingly higher technical requirements for electronic devices such as downscaling and increasing frequencies. As a result, requirements to increase the electrostatic discharge (ESD) immunity of electronic devices have abruptly increased as well. Also, in small high-speed switching devices used in portable devices, etc., and MOS transistors widely used in voltage converter circuits, etc., downscaling the device or reducing the gate oxide film thickness causes concern about reduced ESD immunity.

In such devices, ESD protection diodes are often formed simultaneously on the silicon substrate. In particular, protection elements using polycrystalline silicon have high degrees of freedom during the device manufacturing processes and are widely used.

Because conventional ESD protection diodes are provided in a ring-like closed annular structure, the surface area of the central portion is an ineffective surface area. Therefore, in the case where the junction surface area of a protection diode is increased to obtain a high ESD immunity, the ineffective surface area increases and the surface area of the entire device increases.

Therefore, there have been proposals to provide a high breakdown-voltage protection diode by connecting a ring-like protection diode formed in a chip peripheral portion and the like to a ring-like protection diode formed in a peripheral portion of an electrode pad.

DETAILED DESCRIPTION

Figure 1:
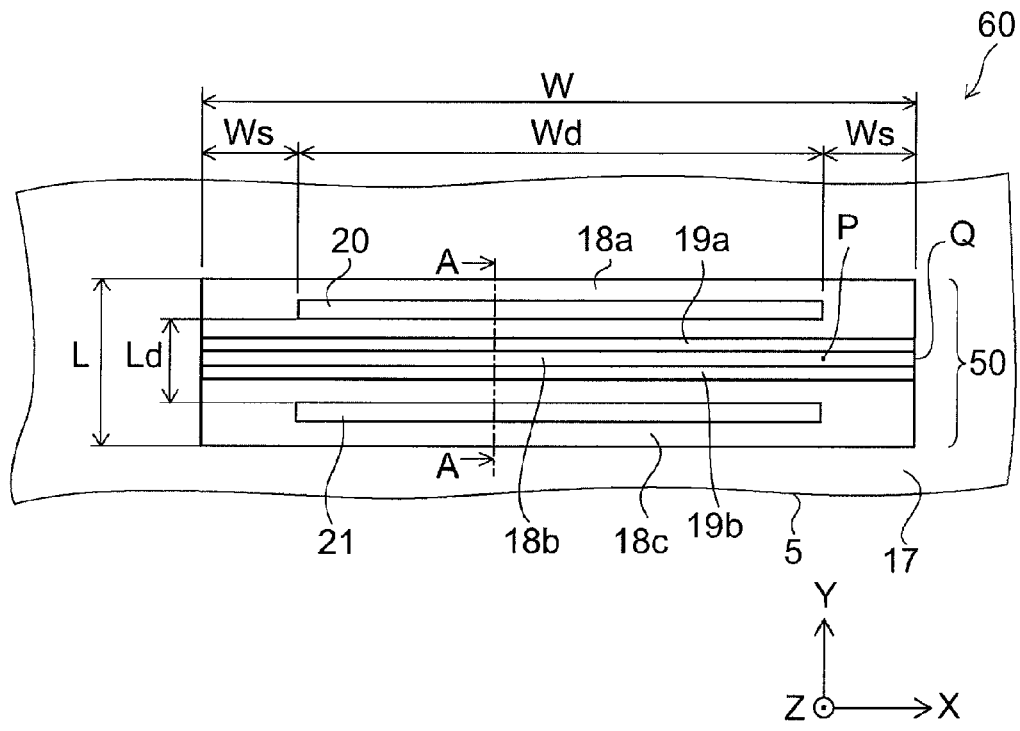
FIG. 1 is a schematic plan view illustrating the configuration of a semiconductor device according to an embodiment.

In general, according to one embodiment, a semiconductor device includes a semiconductor region, a first and second electrodes. The semiconductor region is provided on the semiconductor substrate via an insulating film. The semiconductor region includes a protection diode. An overvoltage causes breakdown of the protection diode. A PN junction of the protection diode is exposed at an end face of the semiconductor region. A first and second electrodes are provided distally to the exposed end face of the PN junction. The first and second electrodes are connected to the semiconductor region to provide a current to the protection diode.

Exemplary embodiments of the invention will now be described in detail with reference to the drawings.

The drawings are schematic or conceptual; and the relationships among the configurations and the lengthwise and crosswise dimensions of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

FIG. 1 is a schematic plan view illustrating the configuration of a semiconductor device according to an embodiment.

Figure 2:
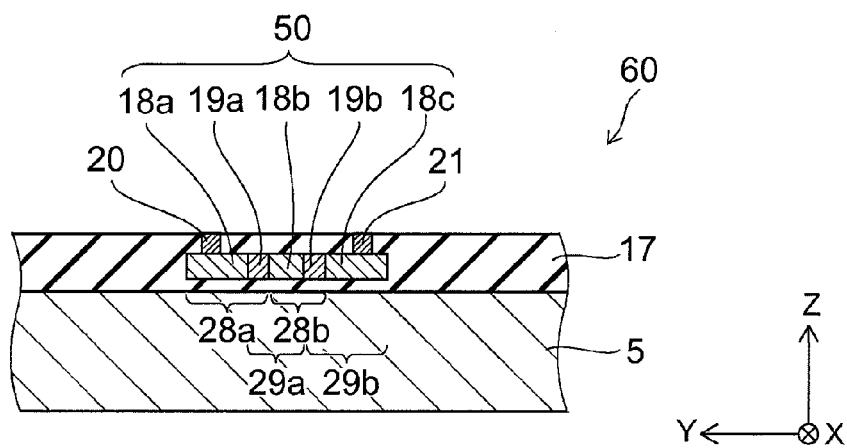
FIG. 2 is a cross-sectional view along line A-A of the semiconductor device illustrated in FIG. 1.

FIG. 2 is a cross-sectional view along line A-A of the semiconductor device illustrated in FIG. 1.

As illustrated in FIGS. 1 to 2, a semiconductor device 60 of this example includes a semiconductor substrate 5, an insulating film 17, a semiconductor region 50, and first and second electrodes 20 and 21.

The semiconductor region 50 is provided on the semiconductor substrate 5 via the insulating film 17. The case is illustrated in this example where the semiconductor region 50 has a band configuration. N-type semiconductor regions 18a, 18b, and 18c are formed alternately with P-type semiconductor regions 19a and 19b in the semiconductor region 50 in striped configurations to an end face Q (a side wall). In other words, PN junctions among the N-type semiconductor regions 18a, 18b, and 18c and the P-type semiconductor regions 19a and 19b are exposed at the end face Q (the side wall) of the semiconductor region 50. The electrodes 20 and 21 are provided distally to the end face Q.

The P-type semiconductor region 19a and the N-type semiconductor region 18a form a protection diode 28a. Similarly, the P-type semiconductor region 19b and the N-type semiconductor region 18b form a protection diode 28b. The P-type semiconductor region 19a and the N-type semiconductor region 18b form a protection diode 29a. The P-type semiconductor region 19b and the N-type semiconductor region 18c form a protection diode 29b.

The multiple protection diodes 28a, 29a, 28b, and 29b are formed in the semiconductor region 50 and connected in series in an NPNPN structure.

The first electrode 20 and the second electrode 21 are connected to the N-type semiconductor regions 18a and 18c of the semiconductor region 50, respectively. An overvoltage applied to the first electrode 20 and the second electrode 21 causes breakdown to occur in the protection diodes 28a, 29a, 28b, and 29b having the NPNPN structure; and a current flows.

As described below with reference to FIG. 6, such a semiconductor region 50 may be integrated with other elements such as transistors. In such a case, the configuration of the semiconductor region 50 is not limited to the straight-line band configuration illustrated in FIG. 1. The configuration of the semiconductor region 50 also may be a band configuration bent in various configurations such as an L-shape, a cranklike configuration, etc. The planar configuration of the protection diode also may have a band configuration bent in various configurations corresponding to the configuration of the semiconductor region 50.

Herein, as illustrated in FIG. 1, a major surface of the semiconductor region 50 is taken as an XY plane. A first direction perpendicular to the XY plane is taken as a Z axis. The direction of the current flowing between the first and second electrodes 20 and 21 is taken as a Y axis. An X axis is taken to be perpendicular to the Y axis and the Z axis.

The first and second electrodes 20 and 21 have a spacing Ld therebetween in the Y axis direction.

In such a case, the end face Q (the side wall) of the semiconductor region 50 where the PN junctions of the protection diodes 28a, 29a, 28b, and 29b are exposed is formed a distance of at least the spacing Ld outside of an end portion P of the first and second electrodes 20 and 21 in the X axis direction. In other words, the semiconductor region 50 is formed such that Ws≧Ld is satisfied, where Ws is the distance between the end face Q and the end portion P.

Although the end face Q and the end portion P are illustrated in FIG. 1 only for the right side of the electrodes 20 and 21 and the semiconductor region 50, the left side is similar.

The semiconductor device 60 of this example can be manufactured by, for example, the following manufacturing processes.

First, an oxide film (the insulating film) 17 is formed with, for example, a film thickness of 0.5 μm on an N-type silicon substrate 5. Thereupon, a polycrystalline silicon region (the semiconductor region) 50 is formed with, for example, a film thickness of 0.6 μm. Further, the oxide film (the insulating film) 17 is formed with, for example, a film thickness of 0.1 μm.

Then, boron (B) ion implantation is performed into the polycrystalline silicon region (the semiconductor region) 50 with, for example, an acceleration voltage of 40 keV and a dose of $5 \times 10^{13}$ cm$^{-2}$. The polycrystalline silicon region (the semiconductor region) 50 is a P-type semiconductor region.

Using photolithography and, for example, RIE (Reactive Ion Etching), unnecessary regions of the polycrystalline silicon region (the semiconductor region) 50 are removed.

The oxide film (the insulating film) 17 is formed on the entire surface.

Subsequently, arsenic (As) ion implantation is performed in selective regions of the polycrystalline silicon region (the semiconductor region) 50 using photolithography. The ion implantation is performed with, for example, an acceleration voltage of 70 keV and a dose of $5 \times 10^{14}$ cm$^{-2}$ to form the N-type semiconductor regions 18a, 18b, and 18c. The regions of the polycrystalline silicon region (the semiconductor region) 50 where the arsenic (As) ion implantation is not performed form the P-type semiconductor regions 19a and 19b.

Heat treatment is performed, for example, in a nitrogen gas (N$_2$) atmosphere at a temperature of 900° C. for 20 minutes to activate each of the regions.

The first and second electrodes 20 and 21 are formed on the N-type semiconductor regions 18a and 18c.

Electrode interconnection metal to other electrodes and electrode pads is formed as necessary.

The semiconductor device 60 of this example illustrated in FIG. 1 and FIG. 2 can be manufactured by the manufacturing processes recited above.

The diffusion of the impurities of the ion implantation and the heat treatment recited above is about 1 to 2 μm. Therefore, the minimum length of the N-type semiconductor regions 18a, 18b, and 18c and the P-type semiconductor regions 19a and 19b is about 2 μm. Accordingly, the minimum length of an NPN or PNP structure having three P-type or N-type semiconductor regions is 6 μm.

In the semiconductor device 60 of this example, each of the N-type semiconductor regions 18a, 18b, and 18c and the P-type semiconductor regions 19a and 19b is formed with a length of, for example, 4 μm. The distance from the first electrode 20 to the most proximal P-type semiconductor region 19a is, for example, 4 μm. The distance from the second electrode 21 to the most proximal P-type semiconductor region 19b also is, for example, 4 μm.

In such a case, the spacing Ld between the first and second electrodes 20 and 21 in the Y axis direction is 20 μm. In this example, the distance Ws from the end portion P of the first and second electrodes 20 and 21 to the end face Q (the side wall) of the semiconductor region 50 where the PN junctions of the protection diodes 28a, 29a, 28b, and 29b are exposed is, for example, 20 μm.

The case is illustrated in this example where the N-type semiconductor regions 18a, 18b, and 18c and the P-type semiconductor regions 19a and 19b form the protection diodes 28a, 29a, 28b, and 29b having an NPNPN structure. However, the invention is not limited thereto. Any number of N-type semiconductor regions and P-type semiconductor regions may be formed alternately to form any number of protection diodes. Moreover, protection diodes having a PNPNP structure also may be formed.

When an overvoltage is applied to the first electrode 20 and the second electrode 21 of such a semiconductor device 60, breakdown occurs in the protection diodes 28a, 29a, 28b, and 29b formed in the semiconductor region 50; and a current flows.

In the case where a high voltage is applied to the first electrode 20 and a low voltage is applied to the second electrode 21, an overvoltage causes breakdown to occur in the protection diodes 28a and 28b; and a current flows from the first electrode 20 toward the second electrode 21. Conversely, in the case where a low voltage is applied to the first electrode 20 and a high voltage is applied to the second electrode 21, an overvoltage causes breakdown to occur in the protection diodes 29a and 29b; and a current flows from the second electrode 21 toward the first electrode 20.

Figure 3:
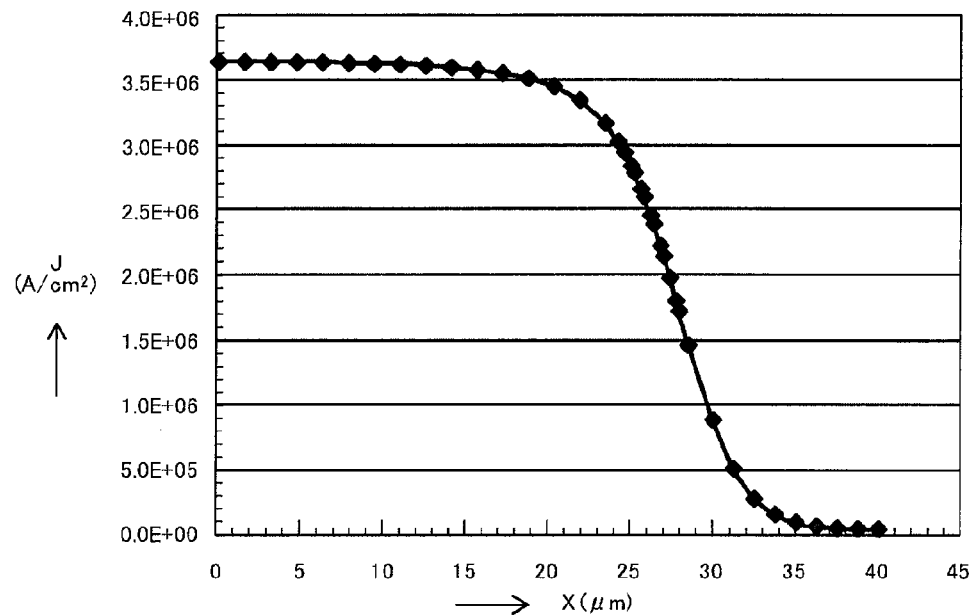
FIG. 3 is a graph of calculated values of a current density of the semiconductor device illustrated in FIG. 1.

FIG. 3 is a graph of calculated values of a current density of the semiconductor device illustrated in FIG. 1.

The direction of the X axis in FIG. 3 corresponds to the direction of the X axis illustrated in FIG. 1. The positions of the X axis in FIG. 3 are taken to be the positions passing through the center of the N-type semiconductor region 18b in the vertical direction in FIG. 1. The Y axis is set as illustrated in FIG. 1 with an origin O of the centers of the first and second electrodes 20 and 21 in the X axis direction. A current density J is taken as the current density in the Y direction along the X axis in the case where a current 2×I flows between the first and second electrodes 20 and 21.

In FIG. 3, a position X along the X axis in such a case is plotted on the horizontal axis; and the calculated value of the current density J in the Y axis direction is plotted on the vertical axis.

For the calculation of the current density J, the thickness of the semiconductor region 50 is taken to be 1 μm; and the Y axis direction length of each of the first and second electrodes 20 and 21 is taken to be 6 μm. An X axis direction width Wd of each of the first and second electrodes 20 and 21 is taken to be 50 μm; and the current 2×I is 2 A.

In other words, the end portion P of the first and second electrodes 20 and 21 has a position of X=±Wd/2=±25 μm. In FIG. 1, the semiconductor device 60 is symmetric to the left and right. Therefore, in FIG. 3, the current density J in the Y axis direction along the X axis is calculated for the case where a current I of 1 A flows in the portion of $0 \leq X \leq 25$ μm.

From symmetry, the current I flows parallel to the Y axis at X=0. Also, the current I flows parallel to the Y axis at Y=0, that is, along the X axis.

For ESD assuming an Human Body Model (HBM), a current of 1 A corresponds to 1500 V when converted to the voltage of the HBM. For the entire semiconductor device 60, a current of 2 A flows and corresponds to 3000 V.

As illustrated in FIG. 3, the current density 3 at a position about 10 μm from the end portion P of the first and second electrodes 20 and 21 is substantially zero. Also at the end face Q (the side wall) of the semiconductor region 50 where the PN junctions of the protection diodes 28a, 29a, 28b, and 29b are exposed, there is no large concentration of recombination current.

Accordingly, according to the semiconductor device 60 of this example as described below, a protection diode structure can be obtained having a high ESD immunity and a low ineffective surface area.

A semiconductor device of a comparative example will now be described.

Figure 4:
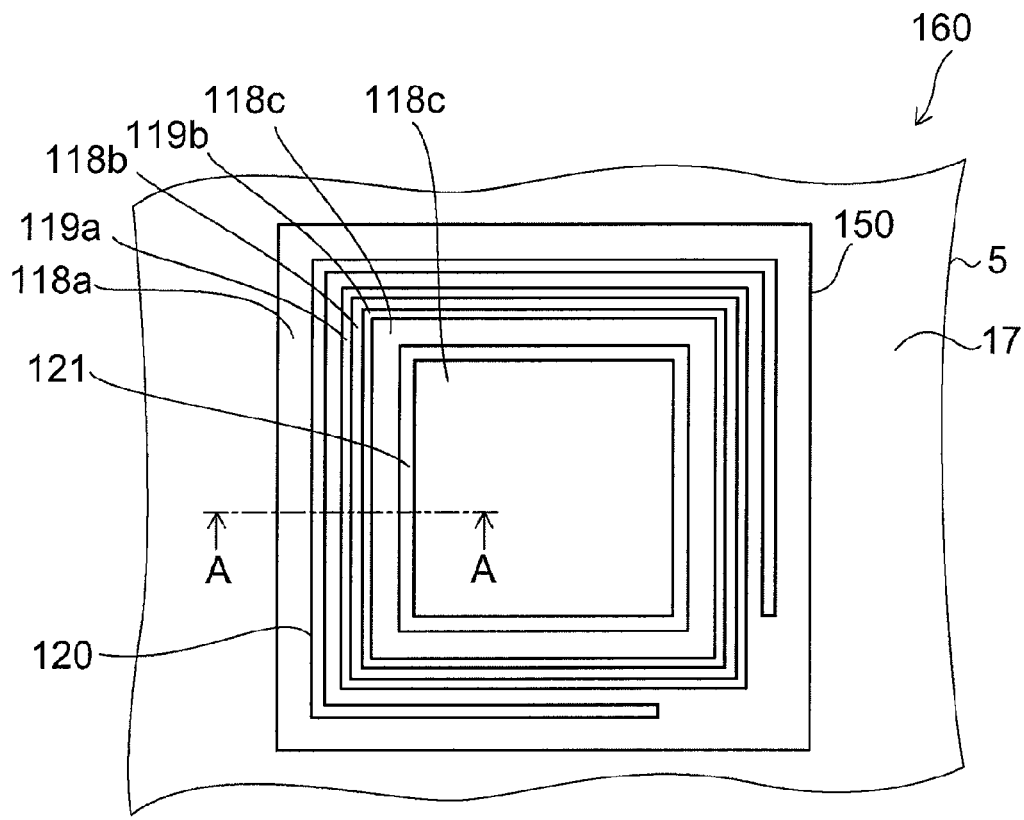
FIG. 4 is a schematic plan view of a semiconductor device of a comparative example.

FIG. 4 is a schematic plan view of the semiconductor device of the comparative example.

As illustrated in FIG. 4, a semiconductor device 160 of the comparative example includes the semiconductor substrate 5, the insulating film 17, a polycrystalline silicon region 150, and first and second electrodes 120 and 121.

The cross-sectional view along line A-A of the semiconductor device 160 of the comparative example is similar to the cross-sectional view along line A-A of the semiconductor device 60 of this example illustrated in FIG. 2.

However, in the semiconductor device 160 of the comparative example, an N-type semiconductor region 118c is formed in a rectangular configuration inside the second electrode 121 as well. The planar configuration of the polycrystalline silicon region 150 also is a rectangular configuration. The planar configurations of N-type semiconductor regions 118a, 118b, and 118c and P-type semiconductor regions 119a and 119b are concentric rectangular configurations formed alternately; and the PN junctions have closed annular structures. Therefore, in the semiconductor device 160 of the comparative example, the polycrystalline silicon region 150 does not have an end face (side wall) where the PN junctions are exposed. Otherwise, the semiconductor device 160 is similar to the semiconductor device 60 of this example illustrated in FIG. 1 to FIG. 2.

In other words, the P-type semiconductor region 119a and the N-type semiconductor region 118a form a protection diode 128a. Similarly, the P-type semiconductor region 119b and the N-type semiconductor region 118b form a protection diode 128b. The P-type semiconductor region 119a and the N-type semiconductor region 118b form a protection diode 129a. The P-type semiconductor region 119b and the N-type semiconductor region 118c form a protection diode 129b.

The multiple protection diodes 128a, 129a, 128b, and 129b are formed in the polycrystalline silicon region 150 and connected in series in an NPNPN structure.

The N-type semiconductor region 118a of the outermost portion of the polycrystalline silicon region 150 and the N-type semiconductor region 118c of the innermost portion of the polycrystalline silicon region 150 are connected to the first electrode 120 and the second electrode 121, respectively. By applying an overvoltage to the first electrode 120 and the second electrode 121, breakdown occurs in the protection diodes 128a, 129a, 128b, and 129b having the NPNPN structure; and a current flows. Because the current flows between the first electrode 120 and the second electrode 121, the portion of the N-type semiconductor region 118c inside the second electrode 121 is an ineffective surface area as described below.

The semiconductor device 160 of the comparative example forms, for example, an ESD protection diode of a MOS transistor formed on the same semiconductor substrate 5 by electrically connecting the first electrode 120 and the second electrode 121 to the source and gate of the MOS transistor, respectively.

In the case where an ESD voltage is applied between the gate and source of the MOS transistor, breakdown occurs in the protection diodes 128a, 129a, 128b, and 129b of the semiconductor device 160; and a current flows. In other words, the ESD voltage is discharged between the gate and source via the diode structure; and the MOS transistor is protected.

However, the planar configuration of the diode structure has a rectangular configuration in which the PN junctions are formed in closed annular structures. The reason behind such a structure is to not expose the PN junctions at the end face of the polycrystalline silicon region 150 because, in the case where the PN junctions are exposed at the end face of the polycrystalline silicon region 150, the crystalline structure at the end face is disturbed or the end face is a fragmentation region occurring due to the manufacturing process; and therefore, there is a risk of a rapid recombination rate at the end face.

A rapid recombination rate easily causes the undesirable deterioration of the diode characteristics because, in such a region, an amount of energy corresponding to the band gap emitted during the recombination destructs the crystal lattice and further increases the regions having rapid recombination rates. Therefore, an annular structure is employed as a contrivance to avoid the PN junctions from being exposed at the end face of the polycrystalline silicon region 150.

Of course, the protection diode itself must have a high ESD immunity to protect a MOS transistor and the like. It is necessary, to begin with, that the ESD protection diode has a structure that does not easily deteriorate.

However, in the case where the annular structure is used to avoid deterioration of such a protection diode, the surface area efficiency of the protection diode portion undesirably decreases.

In other words, generally, a greater diode junction surface area provides a better ESD protection function and ensures a greater ESD immunity. Accordingly, it is necessary to make the diode junction surface area as large as possible to obtain a high ESD immunity. However, to increase the diode junction surface area, it is necessary to increase the circumferential length of the rectangles having the annular structures as illustrated in FIG. 4. In such a case, the surface area of the central portion, i.e., the portion of the N-type semiconductor region 118c inside the second electrode 121 illustrated in FIG. 4, is an ineffective surface area. Moreover, this leads to a surface area increase of the entire device and increased manufacturing costs and is industrially unfavorable.

Although it is effective to increase the film thickness of the polycrystalline silicon region 150, in such a case, it is known that problems occur due to cracks and the like due to stress differences among the polycrystalline silicon, the oxide films, and the substrate silicon; and the limit is about 1 μm. Thus, attempts to obtain a protection diode having a good ESD protection function have undesirably caused an increase of the ineffective surface area and an increase of the surface area of the entire device.

Although the case is described in the semiconductor device 160 of the comparative example where the planar configuration of the protection diode is a concentric rectangular configuration, the case is similar for a ring-like configuration.

Conversely, in the semiconductor device 60 of this example, the protection diodes 28a, 29a, 28b, and 29b are formed in band configurations in the semiconductor region 50; and there is little ineffective surface area.

In other words, as illustrated in FIG. 3, it is conceivable that a current path may be formed between the first and second electrodes 20 and 21 in the case where the ESD voltage is applied. In such a case, although the current path spreads outward, the degree of the spread is about the inter-electrode distance Ld or less. Accordingly, even when the ESD voltage is applied, the current does not reach the PN junction exposed portion of the end face Q (the side wall) of the semiconductor region 50; and diode structure does not deteriorate radically.

Thus, according to the semiconductor device 60 of this example, a protection diode structure can be obtained in which a large recombination current does not concentrate at the PN junction exposed portion of the end face Q (the side wall) of the semiconductor region 50; the ESD immunity is high; and the ineffective surface area is low.

Figure 5:
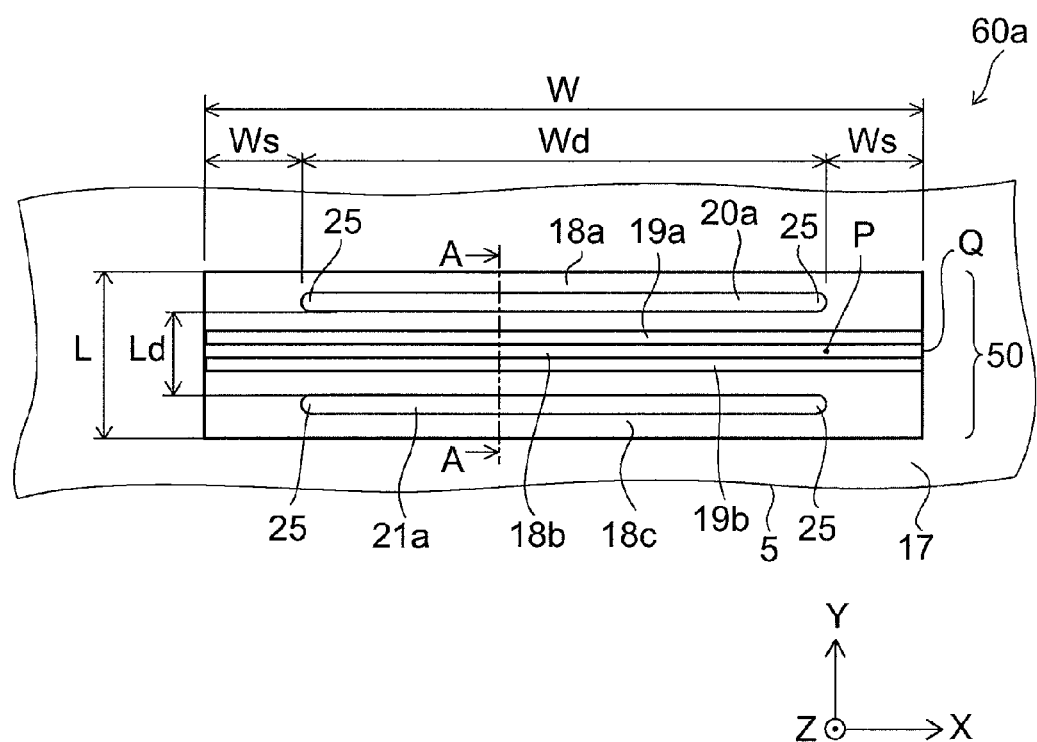
FIG. 5 is a schematic plan view illustrating another configuration of the semiconductor device according to an embodiment.

FIG. 5 is a schematic plan view illustrating another configuration of the semiconductor device according to an embodiment.

As illustrated in FIG. 5, a semiconductor device 60a of this example includes the semiconductor substrate 5, the insulating film 17, the semiconductor region 50, and first and second electrodes 20a and 21a.

In the semiconductor device 60a, both end portions 25 in the X axis direction of the first and second electrodes 20a and 21a are formed in semicylindrical configurations. In other words, as illustrated in FIG. 5, the planar configurations of the first and second electrodes 20a and 21a differ from those of the semiconductor device 60 in that both end portions 25 in the X axis direction are formed in arc-like configurations having radii of, for example, 3 μm. Otherwise, the semiconductor device 60a is similar to the semiconductor device 60.

Although a configuration is illustrated in this example in which both end portions 25 are formed in arc-like configurations, the configuration is not limited to an arc-like configuration. It is sufficient for the configuration to have a curvature relaxation portion. In other words, it is sufficient for the planar configurations of both end portions 25 such as those illustrated in FIG. 5 to be non-polygonal and to be formed of a curve.

In the case where the end portion configurations of the first and second electrodes 20 and 21 are nearly perpendicular, current concentration occurs due to electric field concentration; abnormal heating occurs at such portions; and as a result, it is conceivable that diode deterioration also may occur. Therefore, by providing a curvature relaxation portion in the end portions 25, such abnormal current concentration is avoided; and the deterioration of the diode structure can be suppressed.

Accordingly, in the semiconductor device 60a, a large recombination current does not concentrate at the PN junction exposed portion of the end face Q (the side wall) of the semiconductor region 50. A protection diode structure can be obtained in which current does not concentrate in the end portions 25 of the first and second electrodes 20a and 21a; the ESD immunity is high; and the ineffective surface area is low.

Figure 6:
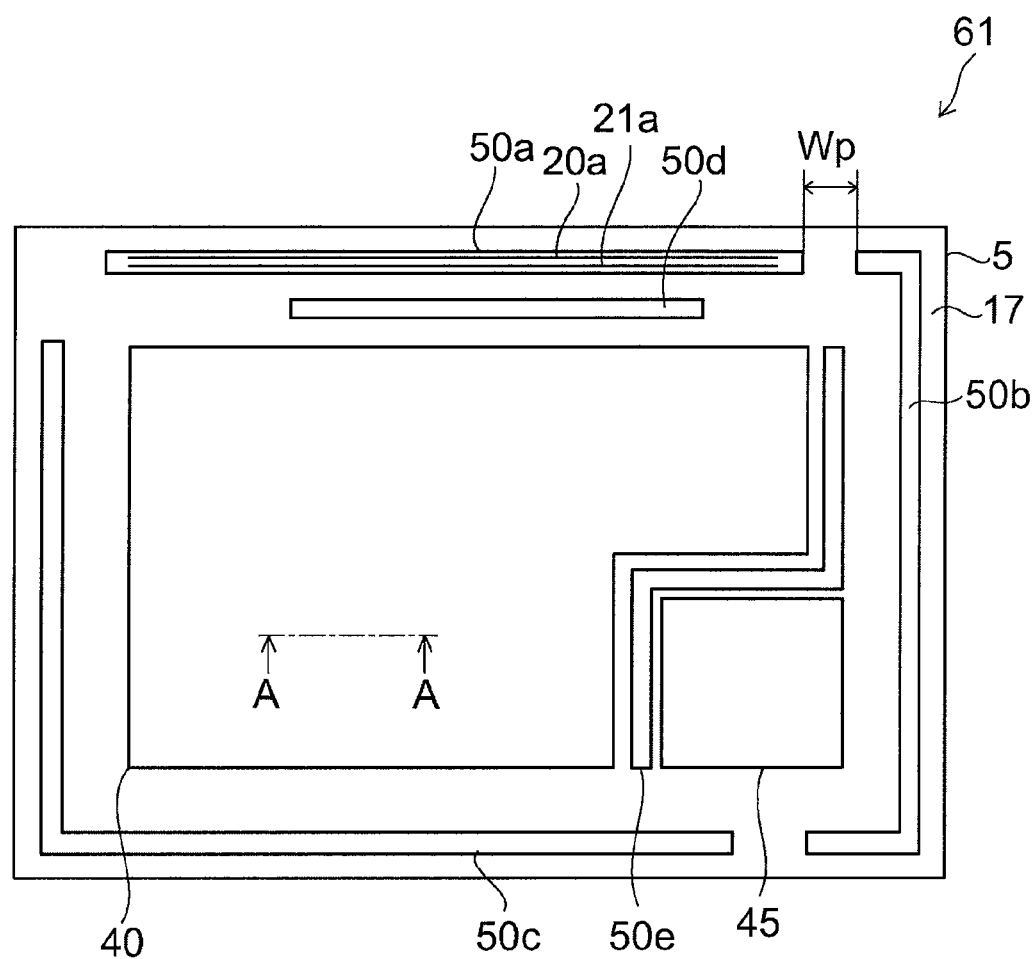
FIG. 6 is a schematic plan view illustrating another configuration of the semiconductor device according to an embodiment.

FIG. 6 is a schematic plan view illustrating another configuration of the semiconductor device according to an embodiment.

As illustrated in FIG. 6, a semiconductor device 61 of this example includes the semiconductor substrate 5, the insulating film 17, semiconductor regions 50a to 50e, the first and second electrodes 20a and 21a, a MOS transistor region 40, and an electrode pad 45.

In the semiconductor device 61 of this example, the semiconductor regions 50a to 50d are provided in a peripheral portion of the semiconductor substrate 5. The semiconductor region 50e is provided in a periphery of the electrode pad 45.

Only the first and second electrodes 20a and 21a connected to the semiconductor region 50a are illustrated. The first and second electrodes connected to the other semiconductor regions 50b to 50e are omitted.

Here, the semiconductor substrate 5, the insulating film 17, the semiconductor region 50a, and the first and second electrodes 20a and 21a are similar to those of the semiconductor device 60a. The planar configurations of the semiconductor regions 50b and 50c are similar to the planar configuration of the semiconductor region 50a except for having U-shaped and L-shaped planar configurations, respectively. The semiconductor region 50d is similar to the semiconductor region 50a except for being provided inside the semiconductor region 50a in the peripheral portion of the semiconductor substrate 5. Although not illustrated, the planar configurations of the protection diodes of the semiconductor regions 50b and 50c, which have the U-shaped and L-shaped planar configurations, may be U-shaped and L-shaped, respectively.

A distance Wp between the semiconductor regions 50a and 50b is not particularly limited and may be zero. However, even in the case where the distance Wp is zero and one end of the semiconductor region 50a is connected to one end of the semiconductor region 50b, the PN junctions are exposed at the end faces of at least the other ends of the semiconductor regions 50a and 50b.

Figure 7:
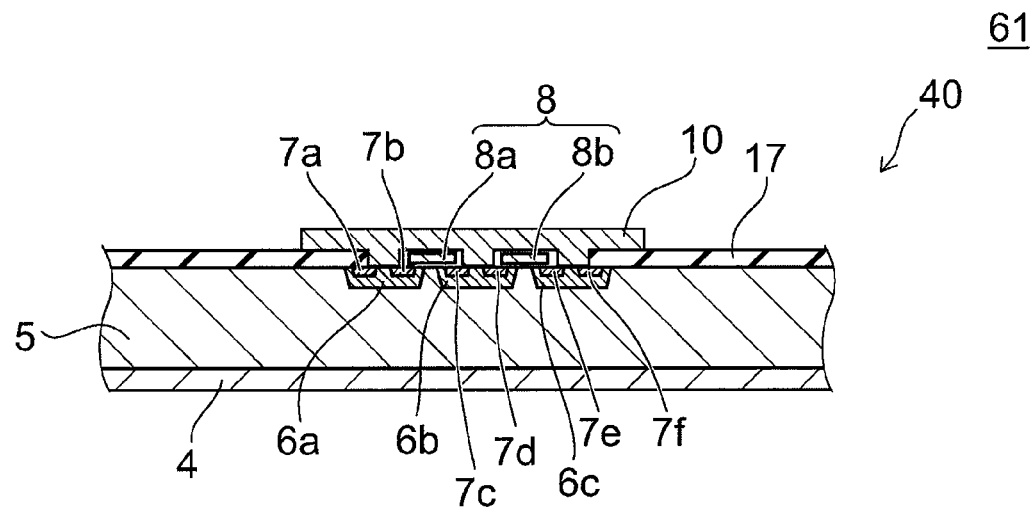
FIG. 7 is a cross-sectional view along line A-A of the semiconductor device illustrated in FIG. 6.

FIG. 7 is a cross-sectional view along line A-A of the semiconductor device illustrated in FIG. 6.

As illustrated in FIG. 7, a bottom face drain electrode 4 is provided on the lower side of the semiconductor substrate 5 in the MOS transistor region 40 of the semiconductor device 61. P-type base regions 6a, 6b, and 6c are formed on the top face of the N-type semiconductor substrate 5. N-type source regions 7a and 7b are formed on the top face of the P-type base region 6a. N-type source regions 7c and 7d are formed on the top face of the P-type base region 6b. N-type source regions 7e and 7f are formed on the top face of the P-type base region 6c.

The MOS transistor region 40 is a region where a MOS transistor element is formed simultaneously with the semiconductor regions 50a to 50e; and the MOS transistor element is protected from ESD by the protection diodes formed in the semiconductor regions 50a to 50e.

The electrode pad 45 is electrically connected (not illustrated) to a gate 8 of the MOS transistor region 40. Although the case is illustrated in this example where one electrode pad 45 is used, any number may be used.

A polycrystalline silicon gate electrode 8a is formed on a region from the N-type source region 7b to the N-type source region 7c via the oxide film 17. Similarly, a polycrystalline silicon gate electrode 8b is formed on a region from the N-type source region 7d to the N-type source region 7e via the oxide film 17.

A source electrode 10 is formed to connect to the N-type source regions 7a to 7e.

The second electrodes 21a of the semiconductor regions 50a to 50e which function as ESD protection diodes are electrically connected (not illustrated) to the polycrystalline silicon gate electrodes 8a and 8b. The first electrodes 20a are electrically connected (not illustrated) to the source electrode 10. Thereby, the MOS transistor region 40 is protected from the ESD voltage applied between the gate and source.

The case is illustrated in this example where the semiconductor substrate 5 is the N-type and the MOS transistor region 40 has an N-channel vertical MOS transistor structure. However, the invention is not limited thereto. A P-type semiconductor substrate may be used. Further, a P-channel MOS transistor region may be included; and a bipolar transistor region may be included.

Hereinabove, exemplary embodiments of the invention are described with reference to specific examples. However, the invention is not limited to these specific examples. For example, one skilled in the art may appropriately select specific configurations of components of semiconductor devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor devices practicable by an appropriate design modification by one skilled in the art based on the semiconductor devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device, comprising:
    a semiconductor region provided on a semiconductor substrate via an insulating film, the semiconductor region including a protection diode; and
    first and second electrodes connected to the semiconductor region to provide a current to the protection diode,
    a PN junction of the protection diode being exposed at an end face of the semiconductor region,
    the first and second electrodes being provided distally to the exposed end face of the PN junction, and
    a distance from each of the first and second electrodes to the end face of the exposed PN junction being not less than a spacing between the first and second electrodes.

2. The semiconductor device according to claim 1, wherein a planar configuration of the semiconductor region has a bent portion.

3. The semiconductor device according to claim 1, further comprising
    an electrode pad provided on the semiconductor substrate via the insulating film,
    the semiconductor region being provided in a periphery of the electrode pad.

4. The semiconductor device according to claim 3, wherein an end portion of each of the first and second electrodes has a curvature relaxation portion.

5. The semiconductor device according to claim 1, wherein an end portion of each of the first and second electrodes has a curvature relaxation portion.

6. The semiconductor device according to claim 5, wherein a planar configuration of the curvature relaxation portion is a curved configuration.

7. The semiconductor device according to claim 5, wherein a planar configuration of the curvature relaxation portion is an arc-like configuration.

8. The semiconductor device according to claim 1, further comprising
    a transistor provided on the semiconductor substrate,
    the semiconductor region being provided in a periphery of the transistor.

9. The semiconductor device according to claim 8, further comprising
    an electrode pad provided on the semiconductor substrate via the insulating film,
    the semiconductor region being provided in a periphery of the electrode pad.

10. The semiconductor device according to claim 8, wherein a planar configuration of the semiconductor region has a bent portion.

11. The semiconductor device according to claim 8, wherein an end portion of each of the first and second electrodes has a curvature relaxation portion.

12. The semiconductor device according to claim 11, wherein a planar configuration of the curvature relaxation portion is a curved configuration.

13. The semiconductor device according to claim 11, wherein a planar configuration of the curvature relaxation portion is an arc-like configuration.

* * * * *